United States Patent [19]
Sugiura

[11] Patent Number: 5,164,930
[45] Date of Patent: Nov. 17, 1992

[54] OPTICAL PICKUP

[75] Inventor: Satoshi Sugiura, Tokorozawa, Japan

[73] Assignee: Pioneer Electronic Corporation, Tokyo, Japan

[21] Appl. No.: 652,814

[22] Filed: Feb. 8, 1991

[30] Foreign Application Priority Data

Jul. 25, 1990 [JP] Japan ................................. 2-196707
Jul. 25, 1990 [JP] Japan ................................. 2-196710

[51] Int. Cl.$^5$ ........................................... G11B 7/135
[52] U.S. Cl. ................................. 369/44.12; 369/109; 385/14; 385/37
[58] Field of Search .................... 369/44.12, 112, 109; 385/37, 14

[56] References Cited

U.S. PATENT DOCUMENTS

| | | | |
|---|---|---|---|
| 4,823,331 | 4/1989 | Yoshitoshi et al. | 369/112 |
| 4,893,296 | 1/1990 | Matsumoto et al. | 369/112 |
| 5,082,339 | 1/1992 | Linnebach | 385/14 |
| 5,105,403 | 4/1992 | Kando et al. | 369/44.12 |

Primary Examiner—Donald McElheny, Jr.
Attorney, Agent, or Firm—Sughrue, Mion, Zinn, Macpeak & Seas

[57] ABSTRACT

An optical pickup is used to optically read recorded information on an optical information storage medium such as a compact disk in a compact disk player, for example. The optical pickup has a beam splitter having a first facet for reflecting a laser beam from a semiconductor laser toward the optical information storage medium. The right beam reflected from the optical information storage medium passes through and is diffracted by the first facet of the beam splitter. The laser beam then passes through a second facet of the beam splitter, and is then divided by a diffraction grating into a transmitted beam and a diffracted beam that is then guided through an optical waveguide. The beam splitter is simple in structure and can easily be manufactured, and hence the optical pickup is relatively small in size. Another optical pickup includes a phase layer, a polarizer layer, and a diffraction grating in a semiconductor substrate. A laser beam reflected by an optical information storage medium is caused to change the phase by the phase layer, and passes through the polarizer layer to the diffraction grating, which divides the laser beam into a transmitted beam and a diffracted beam. The phase layer and the polarizer layer are fabricated at the same time that the semiconductor substrate is manufactured.

7 Claims, 10 Drawing Sheets

TO OPTICAL DISK 20

FIG. 15A
FIG. 15B
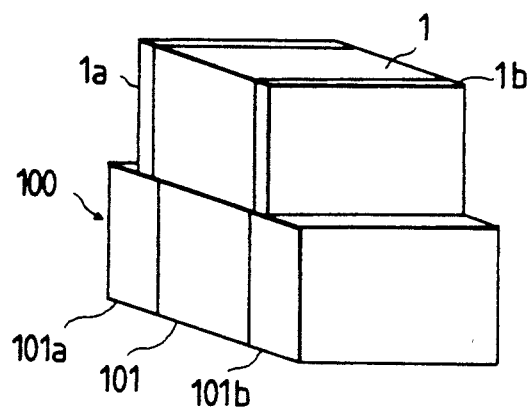
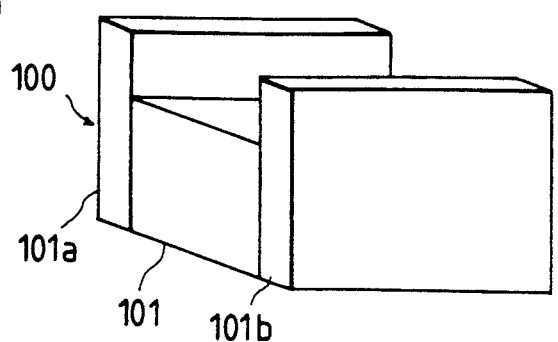
FIG. 16
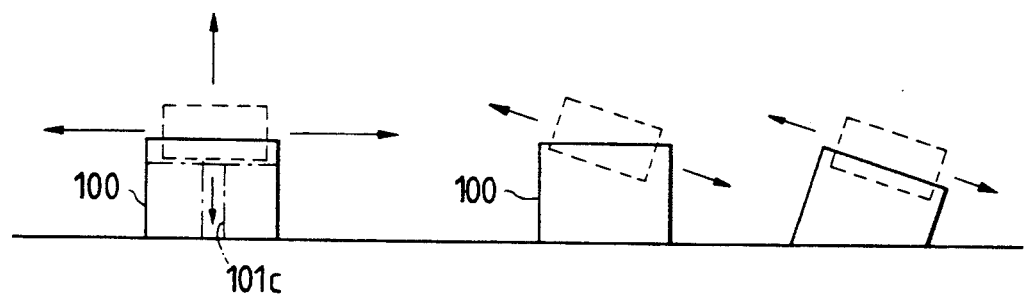
FIG. 17
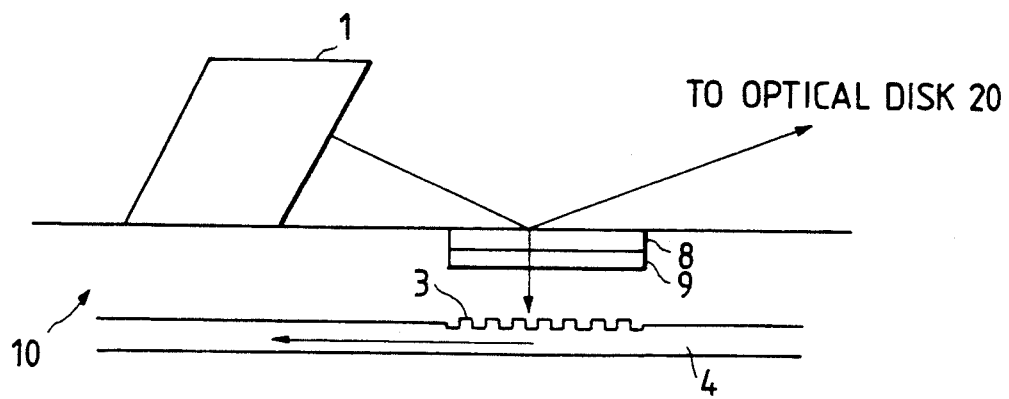

INTENSITY OF LASER BEAM DIRECTLY FROM SEMICONDUCTOR LASER

POLARIZING ANGLE

INTENSITY OF LASER BEAM REFLECTED BY OPTICAL DISK

POLARIZING ANGLE

INTENSITY OF LASER BEAM TRAVELING BACK ($P_{BAK}$) TO SEMICONDUCTOR LASER

POLARIZING ANGLE

OPTICAL PICKUP

BACKGROUND OF THE INVENTION

The present invention relates to an optical pickup for optically reproducing recorded information from an information storage medium or optically recording information in an information storage medium, and more particularly to an optical pickup for reproducing information recorded on an optical disk in a compact disk (CD) player, a laser vision disk (LVD) player, or the like.

Heretofore, optical pickups of the type described above are made up of many discrete components including a semiconductor laser, a polarizing prism, a condensing lens, a photodetector, etc.. It has been difficult to adjust the positions of these individual components relative too each other.

Various optical pickups which include components, except an object lens, mounted on a single semiconductor substrate have been developed. One such optical pickup is disclosed in Japanese Laid-Open Patent Publication No. 64(1989)-33734. The disclosed optical pickup comprises a semiconductor substrate, a semiconductor laser mounted on the semiconductor substrate for emitting a laser beam to read recorded information, a beam splitter mounted on the semiconductor substrate for reflecting the laser beam toward an optical disk and dividing a laser beam reflected from the optical disk into two laser beams through a plurality of reflections, and first and second photodetectors mounted on the semiconductor substrate for detecting the intensities of the two reflected laser beams from the beam splitter. Based on the laser beam intensities detected by the first and second photodetectors, the presence and absence of pits or holes in the recording surface of the optical disk are converted into an electric RF signal for reproducing the information recorded in the optical disk.

In order to divide the laser beam reflected from the optical disk into the two laser beams, the reflected laser beam has to be reflected a plurality of times by the beam splitter. Because of this requirement, a plurality of facets of the beam splitter need to be ground into smooth surfaces. In addition, a dielectric multilayer film is evaporated on one of the ground facets to provide a semireflecting mirror surface thereon, and a reflective film is deposited on the other ground facet. Therefore, the conventional optical pickup suffers a first problem in that a complex process is required to fabricate the beam splitter, and the optical pickup is relatively large in size.

Furthermore, it is necessary to produce the beam splitter separately from the semiconductor substrate. Since it is difficult to manufacture the beam splitter with precision, the prior optical pickup has a second problem in that the beam splitter cannot be reduced in size, and hence the size of the overall optical pickup remains relatively large in size. Moreover, the beam splitter has to be subsequently mounted on the semiconductor substrate with high accuracy, resulting in a third problem as to a yield reduction. A fourth problem of the conventional optical pickup is that the junction between the semiconductor and the beam splitter mounted thereon causes a loss of optical energy.

SUMMARY OF THE INVENTION

In view of the first problem of the conventional optical pickup, it is an object of the present invention to provide an optical pickup which includes a beam splitter that can be manufactured with ease, and which is relatively small in size.

In view of the second, third, and fourth problems of the conventional optical pickup, it is an object of the present invention to provide an optical pickup which includes a beam splitter that can be manufactured simultaneously with a semiconductor substrate, which is relatively small in size, and which can effectively utilize the intensity of a laser beam at an increased rate.

According to the present invention, there is provided an optical pickup comprising a semiconductor substrate, light-emitting means mounted on the semiconductor substrate, for emitting a light beam, beam-splitting means disposed on the semiconductor substrate, for reflecting, with a first facet thereof, the light beam emitted by the light-emitting means toward a optical information storage medium, and passing the light beam reflected by the optical information storage medium through the first facet toward a second facet thereof, and light-diffracting means disposed in the semiconductor substrate, for dividing the light beam from the second facet into a transmitted light beam and a diffracted light beam.

The light beam emitted from the light-emitting means is reflected toward the optical information storage medium by the first facet, and the light beam reflected by the optical information storage medium is refracted by and passes through the first facet toward the second facet. The light beam passes through the second facet and is divided by the light-diffracting means into the transmitted light beam and the diffracted light beam which is then guided through an optical waveguide. The beam-splitting means is relatively simple in structure and can easily be manufactured. The optical pickup is relatively small in size.

According to the present invention, there is also provided an optical pickup comprising a semiconductor substrate, light-emitting means mounted on the semiconductor substrate, for emitting a light beam, a phase layer disposed in the semiconductor substrate, for developing a phase difference between the light beam emitted by the light-emitting means and the light beam reflected by the optical information storage medium, a polarizer layer disposed underneath the phase layer in the semiconductor substrate, for selectively reflecting and passing the light beams which have passed through the phase layer, and light-diffracting means disposed in the semiconductor substrate, for dividing the light beam reflected by the optical information storage medium and passing through the polarizer layer into a transmitted light beam and a diffracted light beam.

The light beam emitted from the light-emitting means is reflected to the optical information storage medium by the phase layer and the polarizer layer. The light beam reflected by the optical information storage medium is caused to change its phase by the phase layer, and passes through the polarizer layer. The light beam having passed through the polarizer layer is divided by the light-diffracting means into the transmitted light beam and the diffracted light beam which is then guided through an optical waveguide. At the same time that the semiconductor substrate is manufactured, the phase layer, the polarizer layer, and the light diffracting means are fabricated in a small size in a single process with high precision. The optical pickup can easily be manufactured, is relatively small in size, and can effectively utilize the intensity of the laser beam at an increased rate.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 15A and 15B are perspective views of different mount bases on which the semiconductor laser is mounted;

FIG. 16 shows modified mount bases;

FIG. 17 is a side elevational view showing the principles of an optical pickup according to a second embodiment of the present invention;

DETAILED DESCRIPTION OF THE PREFERRED EMBODIMENT

Figure 1:
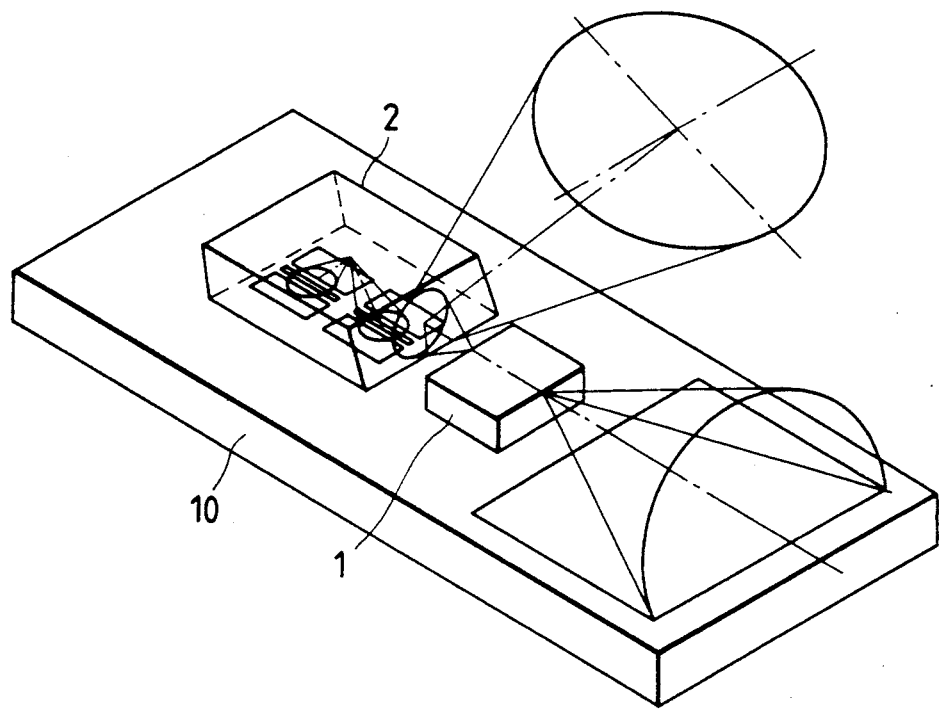
FIG. 1 is a schematic perspective view of a general optical pickup.

Like or corresponding parts are denoted by like or corresponding reference numerals throughout views.

(a) General Description of the Invention:

Prior to describing the preferred embodiments of the present invention, a general conventional optical pickup will first be described below with reference to FIGS. 1 and 2 for an easier understanding of the present invention.

Figure 2:
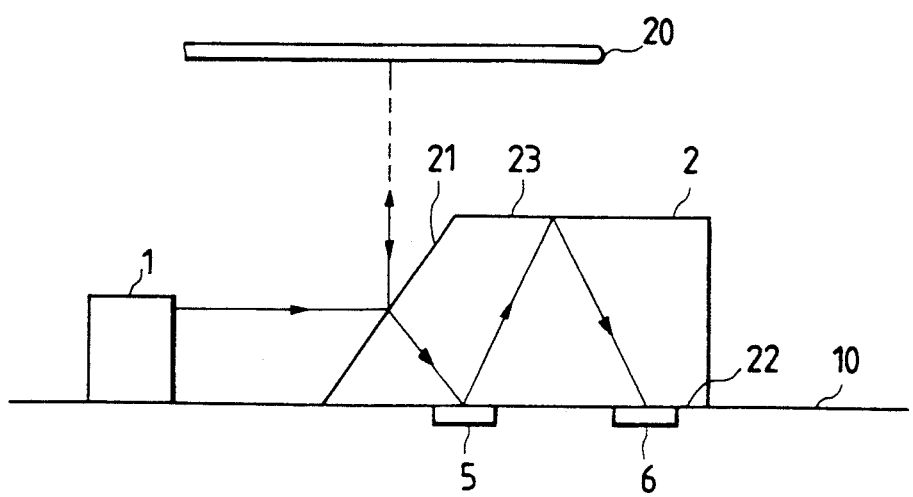
FIG. 2 is a side elevational view of the general optical pickup shown in FIG. 1.

As shown in FIGS. 1 and 2, a general conventional optical pickup includes a semiconductor laser 1 disposed on a semiconductor substrate 10, for emitting a laser beam toward an optical disk 20, and a beam splitter 2 also disposed on the semiconductor substrate 10. The beam splitter 2 has a facet 21 for reflecting the laser beam emitted from the semiconductor laser 1 toward the optical disk 20, a facet 22 on the semiconductor substrate 10 for reflecting a portion of the laser beam that has been reflected by the optical disk 20 and passed through the facet 21, and a facet 23 opposite to the facet 22 for reflecting a portion of the laser beam reflected from the facet 22 toward the facet 22 again. The optical pickup also includes a first photodetector 5 embedded in the surface of the semiconductor substrate 10 which is held against the facet 22, for detecting the laser beam reflected from the optical disk 20 and passing through the facet 21, and a second photodetector 5 embedded in the surface of the semiconductor substrate 10 and spaced from the first photodetector 5, for detecting the laser beam reflected from the facet 23 toward the facet 22.

The general optical pickup shown in FIGS. 1 and 2 operate as follows: The laser beam emitted from the semiconductor laser 1 is reflected by the facet 21 of the beam splitter 2, and applied through an objective lens (not shown) to the optical disk 20. The laser beam applied to the optical disk 20 is reflected thereby and contains information recorded on the optical disk 20. The laser beam reflected by the optical disk 20 travels through the objective lens to the facet 21 of the beam splitter 2.

The reflected laser beam then is refracted by and passed through the facet 21, travels through the beam splitter 2, and is applied to the facet 22 and detected by the first photodetector 5 underneath the facet 22. A portion of the laser beam applied to the facet 22 is reflected thereby toward the opposite facet 23, and is in turn fully reflected by the facet 23. The laser beam reflected by the facet 23 is directed toward the facet 22 and detected by the second photodetector 6 underneath the facet 22.

(b) First Embodiment:

The principles of an optical pickup according to a first embodiment of the present invention will be described below with reference to FIG. 3.

Figure 3:
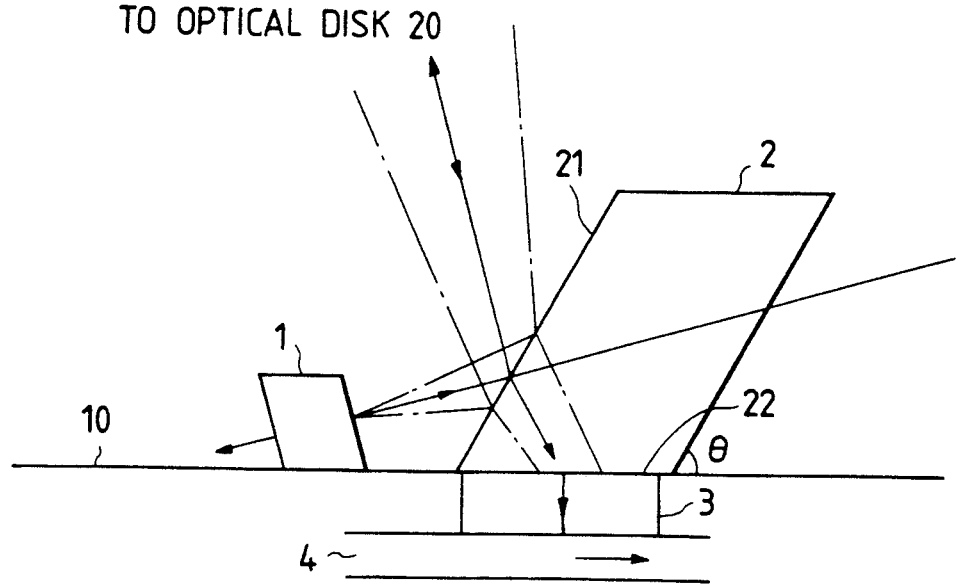
FIG. 3 is a side elevational view showing the principles of an optical pickup according to a first embodiment of the present invention.

As shown in FIG. 3, the optical pickup according to the first embodiment comprises a light-emitting means 1 and a beam-splitting means 2 which are mounted on a semiconductor substrate 10. A light beam emitted by the light-emitting means 1 is reflected by a facet 21 of the beam-splitting means 2 toward an optical information storage medium such as an optical disk. The light beam reflected by the optical information storage medium passes through the facet 21 and travels through the beam-splitting means 2 toward another facet 22 held against the semiconductor substrate 10. The light beam then passes through the facet 22 and is divided by a light-diffracting means 3 embedded in the semiconductor substrate 10, into a transmitted beam of light and a deffracted beam of light which is then guided through an optical waveguide 4.

According to the first embodiment, the light beam reflected from the information storage medium passes through the facet 21 and then through the facet 22 into the light-diffracting means 3. Since the light beam that has entered the beam-splitting means 2 is not reflected a plurality of times, the beam-splitting means 2 can be manufactured with ease, and has a relatively small size, making the entire optical pickup relatively small in size.

The optical pickup according to the first embodiment will be described in further detail with reference to FIGS. 4 through 6.

Figure 4:
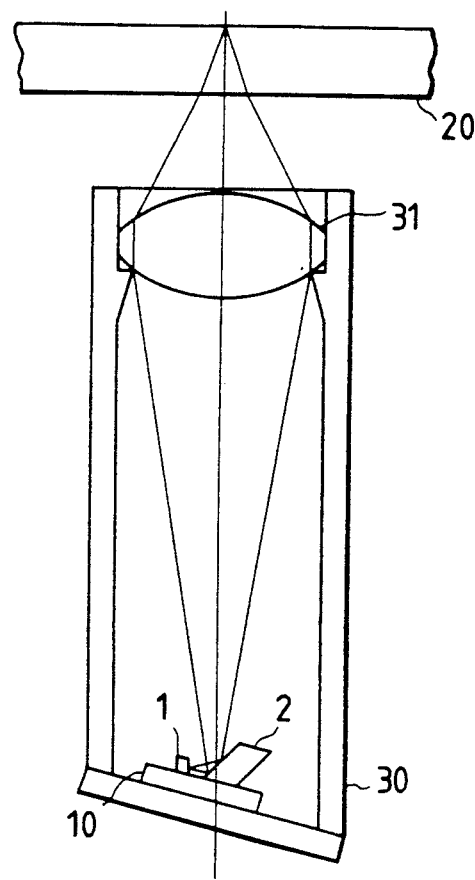
FIG. 4 is a side elevational view of the optical pickup according to the first embodiment.
Figure 5:
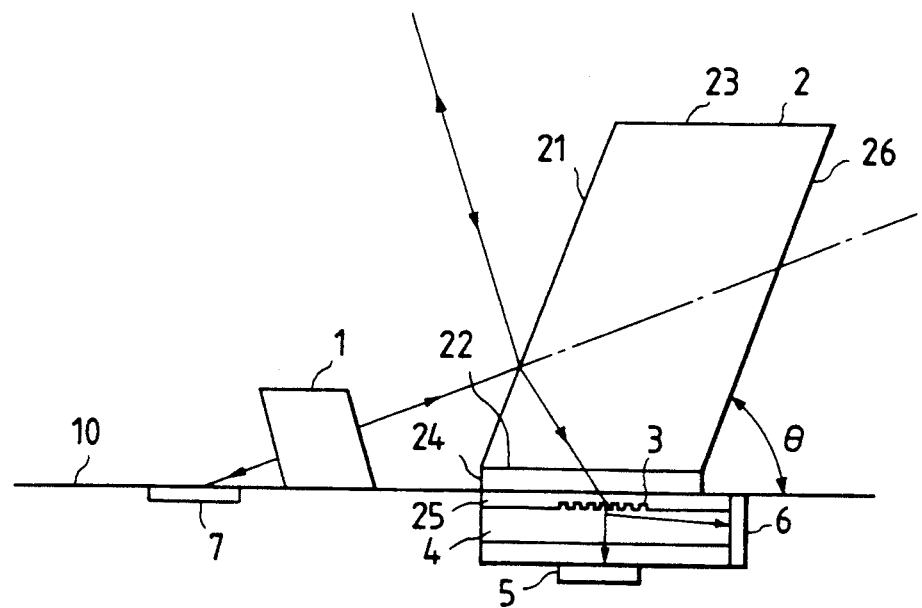
FIG. 5 is a detailed side elevational view of the optical pickup shown in FIG. 4.
Figure 6:
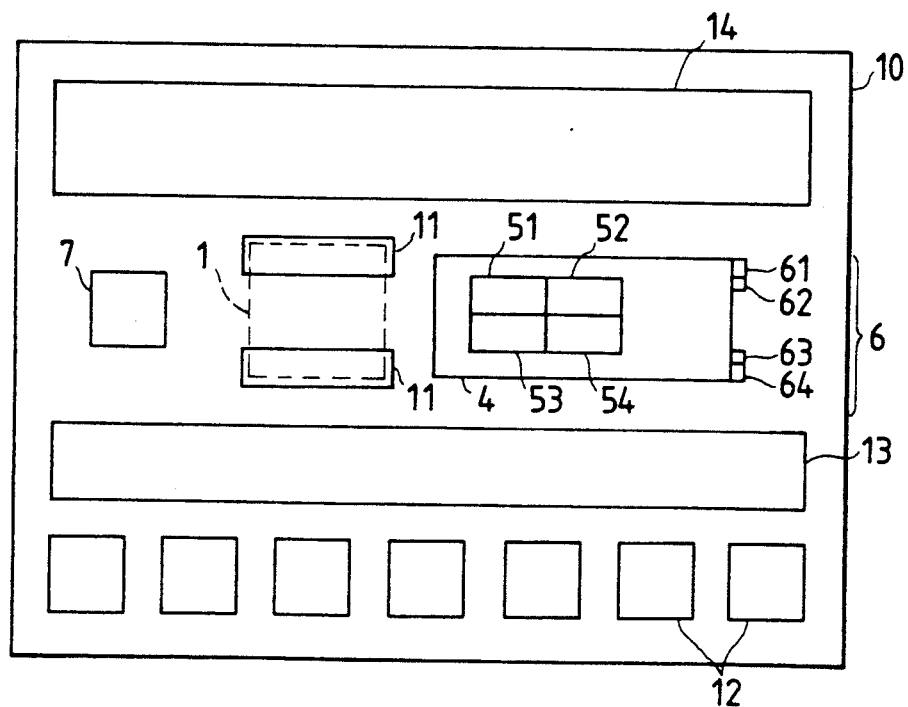
FIG. 6 is a plan view of a semiconductor substrate of the optical pickup shown in FIG. 5.

As shown in FIGS. 4 through 6, the optical pickup according to the first embodiment comprises a semiconductor substrate 10, a semiconductor laser 1 for emitting, from a front end surface thereof, a laser beam to be applied to an optical disk 20, the semiconductor laser 1 being disposed on the semiconductor substrate 10 and having an emission surface inclined with respect to the semiconductor substrate 10, and a beam splitter 2 also disposed on the semiconductor substrate 10. The beam splitter 2 has a facet 21 for reflecting the laser beam emitted from the semiconductor laser 1 toward the optical disk 20, and a facet 22 for reflecting a portion of the laser beam that has been reflected by the optical disk 20 and passed through the facet 21. The laser beam applied to the facet 22 passes therethrough to the semiconductor substrate 10 through an adhesive layer 24 by which the facet 22 is joined to the semiconductor substrate 10. The optical pickup also has a diffraction grating 3 disposed below a cladding layer 25 through a diffracting action of the diffraction grating 3. The optical pickup also includes an optical waveguide 4 disposed underneath the diffraction grating 3 for passing the transmitted beam downwardly and also guiding the diffracted beam horizontally, a first photodetector 5 for detecting the transmitted beam to read a track signal and an RF signal therefrom, a second photodetector 6 for detecting the diffracted beam to read a focus signal therefrom, and a monitor photodetector 7 embedded in the semiconductor substrate 10 for detecting a laser beam which is emitted from a rear end surface of the semiconductor laser 1. The first photodetector 5 is mounted on a side surface of a core layer remotely from the optical waveguide 4.

The semiconductor laser 1 is composed of a semiconductor chip which may be cut from a semiconductor wafer obliquely to a cleavage plane.

The diffraction grating 3 has two regions for dividing the applied beam into two beams perpendicularly to the tracks of the optical disk 20, and has a grating pattern for removing aberrations produced when the beam passes through the beam splitter 2 and converging the diffracted beam onto the second photodetector 6.

The semiconductor substrate 10 has attachment reference marks (not shown) thereon, and the semiconductor laser 1 and the beam splitter 2 are attached to the semiconductor substrate 10 in relation to the attachment reference marks.

As shown in FIG. 4, the semiconductor laser 1, the beam splitter 2, and the semiconductor substrate 10 are fixedly housed in and positioned at one end of a pickup casing 30. An objective lens 31 mounted in the other end of the pickup casing 30 is disposed in facing relation to the optical disk 20.

The optical pickup shown in FIGS. 4 through 6 operates as follows:

The semiconductor laser 1 emits laser beams from its front and rear end surfaces. About half of the laser beam emitted from the front end surface is reflected by the facet 21 of the beam splitter 2, and applied as a focused spot to the information-recorded surface of the optical disk 20 through the objective lens 31. The applied laser beam is diffracted and reflected by the information-recorded surface of the optical disk 20. The diffracted and reflected laser beam travels back through the objective lens 31 to the facet 21 of the beam splitter 2, passes through the fact 21, and travels through the beam splitter 2 to the facet 22.

The other half of the laser beam applied from the semiconductor laser 1 to the facet 21 goes through the facet 21. Since the angle of incidence of this laser beam on the cladding layer 25 beneath the adhesive layer 24 is greater than the critical angle at the surface of the cladding layer 25, the laser beam does not pass through but is fully reflected by the cladding layer 25. The laser beam reflected from the optical disk 20 passes through the facet 21 and is applied to the cladding layer 24 at such an angle that the laser beam is not fully reflected by the cladding layer 24. Therefore, the unwanted laser beam which comes directly from the semiconductor laser 1 through the facet 21 is prevented from entering the first photodetector 5, so that the emitted laser beam is effectively utilized.

The laser beam reflected from the optical disk 20 travels from the facet 22 through the adhesive layer 24 and the cladding layer 25 to the diffraction grating 3, which divides the laser beam into transmitted and diffracted beams through the diffracting action. Most of the reflected laser beam which has reached the diffraction grating 3 is converted into the transmitted beam, which is applied to the first photodetector 5 to generate track and RF signals. Therefore, the intensity of the transmitted beam is higher than the intensity of the transmitted beam is higher than the intensity of the diffracted beam. Since most of the reflected laser beam from the optical disk 20 is converted into the transmitted beam requirements of the diffraction grating 3 for reducing the intensity of the diffracted beam lower than the intensity of the transmitted beam, particularly the depth of the diffraction grating 3, may be lessened or reduced. Consequently, the conditions for designing and manufacturing the optical pickup are rendered less strict.

The diffracted beam is guided through the optical waveguide 4 and reaches the second photodetector 6 which is disposed on an end surface of the optical waveguide 4. The second photodetector 6 comprises two pairs of light detectors 61, 62 and 63, 64 for generating a focus signal from the applied diffracted beam.

The laser beam emitted from the rear end surface of the semiconductor laser 2 is detected by the monitor photodetector 7, which generates an APC (Automatic Power Control) signal. When the optical output power of the semiconductor laser 1 varies with temperature, the drive current supplied to the semiconductor laser 1 is controlled on the basis of the APC signal to keep the optical output power at a constant level.

As shown in FIG. 6, the semiconductor substrate 10 has two mount lands 11 on which the semiconductor laser 1 is mounted, a laser trimming unit 14 for adjusting the semiconductor laser 1 into optimum operating conditions at the time the semiconductor laser 1 is manufactured, an electric circuit 13 for controlling optical output power of the semiconductor laser 1 and processing signals from the photodetectors 5, 6, 7, a plurality of bonding pads 12 for connection to external circuits by wire bonding, an four light detectors 51, 52, 53, 54 which make up the first photodetector 5.

The light detectors 51, 52, 53, 54 produce respective track signals 51a, 52a, 53a, 54a which are applied to the electric circuit 13. The electric circuit 13 produces a tracking control signal by effecting an arithmetic operation on the signals 51a, 52a, 53a, 54a according to the push-pull method characterized by the equation: $(51a+53a)-(52a+54a)$.

The light detectors 61, 62, 63, 64 of the second photodetector 6 produce respective focus signals 61a, 62a, 63a, 64a which are applied to the electric circuit 13. The electric circuit 13 produces a focusing control signal by effecting an arithmetic operation on the signals 61a, 62a, 63a, 64a according to the Foucault knife-edge method characterized by the equation: $(61a-62a)+(64a-63a)$.

The electric circuit 13 includes an APC circuit for adjusting the optical output power of the semiconductor laser 1 based on an APC signal from the monitor photodetector 7.

Since the mount lands 11 are disposed on the semiconductor substrate 10, it is possible to mount the semiconductor laser 1 directly on the semiconductor substrate 10, which includes an optical integrated circuit, through die bonding. Parts, such as wire bonding parts and silicon pads, which would otherwise be necessary to connect the semiconductor laser 1, are no longer required, and the semiconductor laser 1 can be installed in position with increased accuracy.

Examples of dimensions and properties of the adhesive layer 24, the cladding layer 25, the optical waveguide 4, and the core layer are as follows:

|  | Thickness | Refractive index | Material |
|---|---|---|---|
| Adhesive layer | t = 10 μm | n = 1.51 |  |
| Cladding layer | t = 0.5 μm | n = 1.38 | MgF2 |
| Optical waveguide | t = 1.0 μm | n = 1.51 | SiO2 |
| Core layer | t = 2.0 μm | n = 1.38 | MgF2 |

Figure 7:
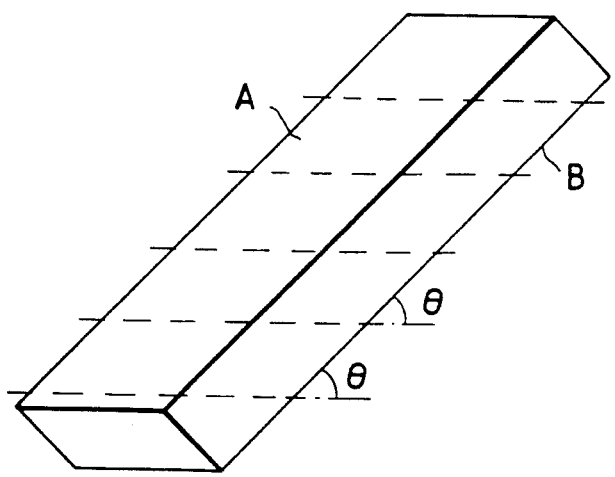
FIG. 7 is a perspective view showing a process of manufacturing a beam splitter of the optical pickup.

(c) Process of Manufacturing the Beam Splitter:

FIG. 7 shows a process of manufacturing the beam splitter 2 of the optical pickup according to the present invention.

A transparent plate has opposite surfaces A, B. Either one of the surfaces A, B is ground into a smooth flat surface, and a dielectric multilayer film is deposited on the ground smooth flat surface, providing a semireflecting mirror surface. The transparent plate with the semireflecting mirror surface thereon is then cut off along planes indicated by the dotted lines at an angle θ with respect to the surfaces A, B, thus producing a plurality of beam splitters.

Therefore, the beam splitter 2 can be fabricated simply by grinding one of the surfaces A, B of the transparent plate forming a semireflecting mirror surface on the ground surface, and cutting off the transparent plate.

The surface (corresponding to the facet 22 in FIG. 3) along which the beam splitter 2 is cut off at the angle θ with respect to the semireflecting mirror surface (corresponding to the facet 21 in FIG. 3) is held in contact with the semiconductor substrate 10, and bonded thereto by an adhesive (corresponding to the adhesive layer 24 in FIG. 3). The adhesive used is transparent and has the same refractive index as that of the beam splitter 2. For example, the adhesive may be of the ultraviolet-curing type. Even if the surface of the beam splitter 2, along which it is cut, is not ground, surface irregularities of this surface are filled with the adhesive and hence made smooth, so that light will not be scattered and reflected by the surface, i.e., the facet 22.

Figure 8:
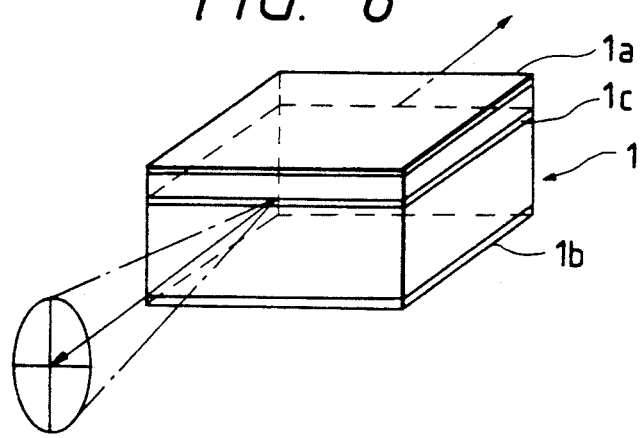
FIG. 8 is a perspective view of a semiconductor laser of the optical pickup.
Figure 9A:
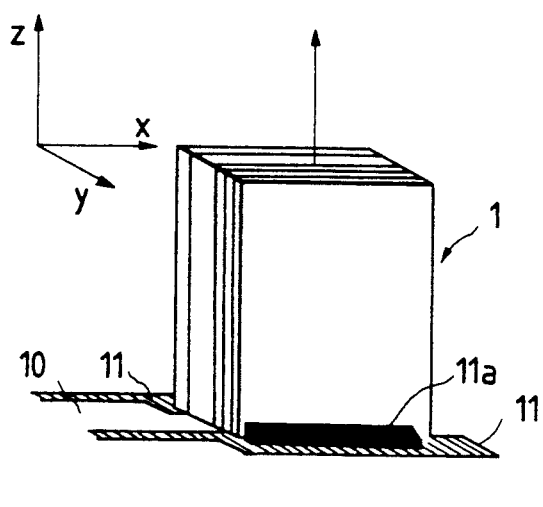
FIGS. 9A and 9B are views showing the manner in which the semiconductor laser is mounted on installation lands on the semiconductor substrate.
Figure 9B:
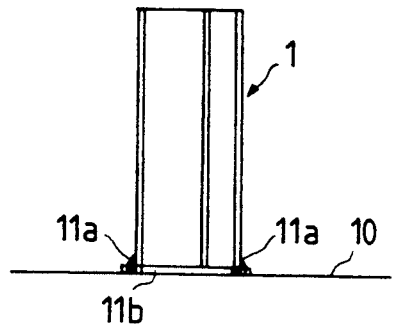

(d) Mounting of the Semiconductor Laser:

FIG. 8 shows the semiconductor laser 1 in perspective, and FIGS. 9A and 9B illustrate the manner in which the semiconductor laser 1 is installed on the semiconductor substrate 10.

Figure 10:
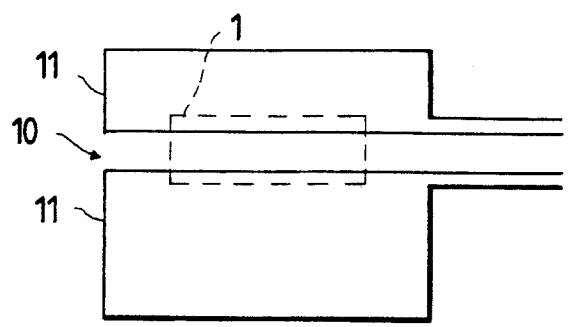
FIGS. 10 and 11 are plan views of modified installation lands.

The mount lands 11 are in the form of aluminum electrodes evaporated on the semiconductor substrate 10. The semiconductor laser 1 has two side electrodes 1a, 1b on opposite sides thereof, and an emission layer 1c. The semiconductor laser 1 is placed on the mount lands 11 and the side electrodes 1a, 1b are soldered to the installation lands 11. Since the mount lands 11 have upper surfaces spaced upwardly from the surface of the semiconductor substrate 10, there is a gap 11b created between the semiconductor laser 1 and the semiconductor substrate 10. The gap 11b prevents the semiconductor laser 1 from directly contacting the semiconductor substrate 10, and hence from being shorted. An insulation may be evaporated in the gap 11b to prevent the semiconductor laser 1 from being shorted. FIG. 10 shows the position of the semiconductor laser 1 on the mount lands 11 according to a modification. The mount lands 11 in the form of aluminum electrodes are larger in size than the area which is required to join and fix the semiconductor laser 1 therein. The large-size mount lands 11 are effective to radiate heat generated by the semiconductor laser 1.

Figure 11:
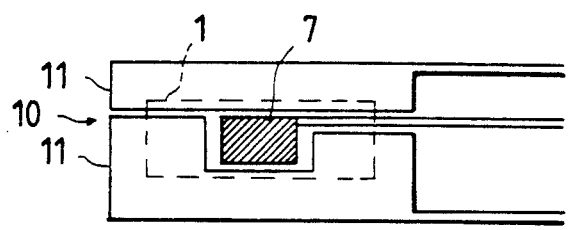

FIG. 11 also illustrates the mount lands 11 on which the semiconductor laser 1 is mounted according to another modification. In FIG. 11, the monitor photodetector 7 is disposed in a recess defined in one of the mount lands 11 and is positioned underneath the semiconductor laser 1.

Figure 12A:
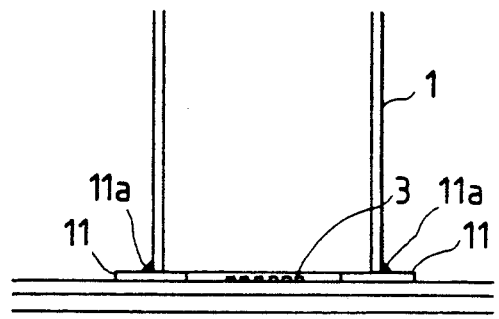
FIG. 12A is a side elevational view of a modification with the diffraction grating underneath the semiconductor laser.
Figure 12B:
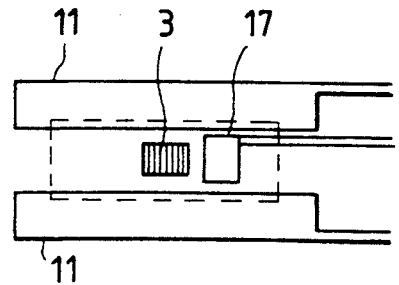
FIG. 12B is a plan view of another modification with the diffraction grating and the monitor photodetector underneath the semiconductor laser.

FIGS. 12A and 12B show modified arrangements in which the semiconductor laser 1 is mounted on the installation lands 11. In FIG. 12A, the diffraction grating 3 is disposed on the semiconductor substrate 10 between the mount lands 11 and immediately underneath the semiconductor laser 1. In FIG. 12B, the diffraction grating 3 and the monitor photodetector 7 are disposed on the semiconductor substrate 10 between the mount lands 11 and immediately underneath the semiconductor laser 1.

Figure 13:
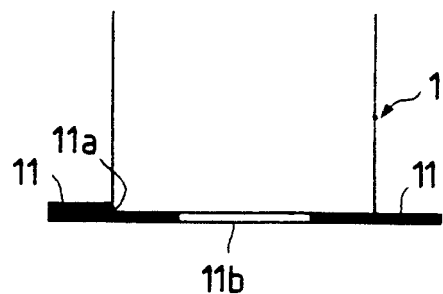
FIG. 13 is a side elevational view of a modified structure by which the semiconductor laser is mounted on the semiconductor substrate.

FIG. 13 also shows a modified structure by which the semiconductor laser 1 is mounted on the semiconductor substrate 10. One of the installation lands 11 has a step 11a for engaging and positioning the semiconductor laser 1 on the mount lands 11 with respect to the semiconductor substrate 10. Therefore, the semiconductor laser 1 can be installed on the mount lands 11 quickly with high precision.

Figure 14A:
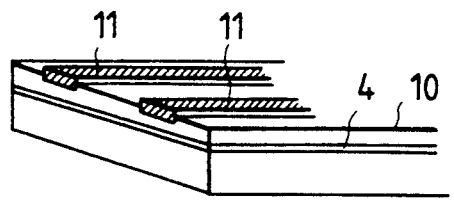
FIGS. 14A, 14B, and 14C show further modifications in which the semiconductor laser is mounted on the semiconductor substrate.
Figure 14B:
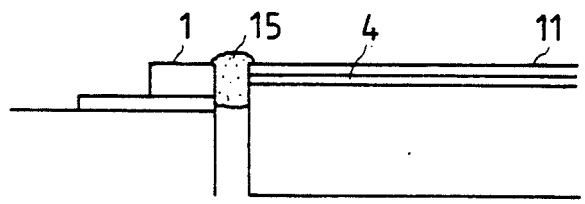
Figure 14C:
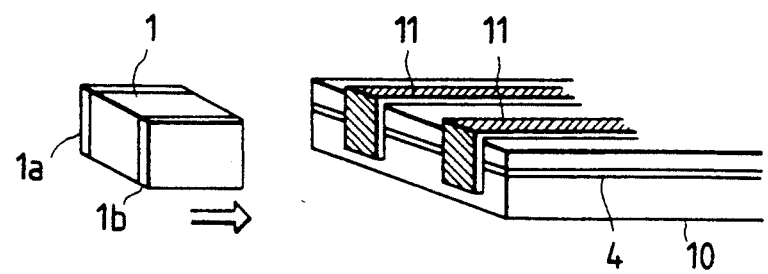

FIGS. 14A, 14B, and 14C show further modifications in which the semiconductor laser 1 is mounted on the semiconductor substrate 10. In FIGS. 14A and 14B, the semiconductor laser is bonded to one side of the semiconductor substrate 10 by an adhesive 15. In FIG. 14C, the mount lands 11 extend as electrodes to a side of the semiconductor substrate 10, and the electrodes 1a, 1b of the semiconductor laser 1 are held against the extended ends of the mount lands 11.

FIGS. 15A and 15B are illustrative of different mount bases 100 on which the semiconductor laser 1 is mounted. In each of FIGS. 15A and 15B, the mount base 100 comprises a nonconductive block 101 sandwiched between two conductive blocks 101a, 101b. In FIG. 15A, the semiconductor laser 1 is placed on and soldered to the blocks 101a, 101b. In FIG. 15B, the semiconductor laser 1 is sandwiched between and soldered to the blocks 101a, 101b. The mount base 100 shown in each of FIGS. 15A and 15B allows the semiconductor laser 1 to be easily mounted on the semiconductor substrate 10.

FIG. 16 shows modified mount bases 100. The nonconductive block 101 of the mount base 100 may have a through hole 101c or may be made of a transparent material to allow the semiconductor laser to emit laser beams in the directions indicated by the arrows. The mount base 100 may have an inclined upper or lower surface on which the semiconductor laser is mounted, so that the semiconductor laser can emit laser beams obliquely upwardly and downwardly.

(e) Modified Beam Splitter:

In FIG. 5, only the facet 21 of the beam splitter 2 is ground and the semireflecting mirror surface is formed thereon. The facet 23 and another facet 26 may have respective nonreflective films for allowing stray light such as scattered light to travel out of the beam splitter 2, so that any undesired laser beam (other than the laser beam reflected from the optical disk 20) from reaching the first photodetector 5. In this manner, the laser beam reflected from the optical disk 20 is effectively utilized at an increased rate.

The beam splitter 2, the adhesive layer 24, the cladding layer 25, and the diffraction grating 3 have respective refractive indexes $n_2$, $n_{24}$, $n_{25}$, $n_3$, which may be related as follows:

$$n_2 > n_{24} > n_{25} > n_3$$

If these refractive indexes are progressively smaller along the direction in which the reflected laser beam travels, as described above, then reflections at the boundaries between the layers are effectively prevented from taking place, allowing the laser beam to pass through the boundaries with high efficiency.

While the diffraction grating 3 is composed of two regions in the above embodiment, the diffractive grating 3 may comprise more than two regions.

Instead of the diffraction grating 3, there may be employed a stepped grating or any of various other optical devices for dividing an applied laser beam into a beam to be guided through the optical waveguide and a beam to be directed to the first photodetector.

(f) Second Embodiment:

The principles of an optical pickup according to a second embodiment of the present invention will be described below with reference to FIG. 17.

As shown in FIG. 17, the optical pickup according to the second embodiment comprises a light-emitting means 1 mounted on a semiconductor substrate 10, a phase layer 8 disposed in the surface of the semiconductor substrate 10, a polarizer layer 9 embedded in the semiconductor substrate 10 underneath the phase layer 8, a light-diffracting means 3 embedded in the semiconductor substrate 10 below the polarizer layer 9, and an optical waveguide 4 embedded in the semiconductor substrate 10 underneath the light-diffracting means 3.

According to the second embodiment, a light beam is emitted from the light-emitting means 1 and applied to the phase layer 8, which passes the laser beam with a phase difference. Only a component of the laser beam which is polarized in the plane of polarization of the polarizer layer 9 passes through the polarizer layer 9. The laser beam which has passed through the polarizer layer 9 is then diffracted by the light-diffracting means 3 and guided through the optical waveguide 4.

The optical pickup according to the second embodiment will be described in further detail with reference to FIGS. 18 through 22.

As shown in FIGS. 18 through 22, the optical pickup according to the second embodiment comprises a semiconductor substrate 10, and a semiconductor laser 1 for emitting a laser beam at an angle $\phi$ of depression with respect to the surface of the semiconductor substrate 10, the semiconductor laser 1 being mounted on a mount base 11 disposed on the semiconductor substrate 10. The optical pickup also has a phase layer 8 disposed in the surface of the semiconductor substrate 10 for passing the laser beam with a phase difference, and a polarizer layer 9 embedded in the semiconductor substrate 10 underneath the phase layer 8, for passing a laser beam which is polarized in the plane of polarization of the polarizer layer 9 and reflecting a laser beam perpendicular to the plane of polarization. A diffraction grating 3 is also embedded in the semiconductor substrate 10 below the polarizer layer 9 with a cladding layer 15 interposed therebetween, for dividing a laser beam which has been reflected from an optical disk 20 and passed through the polarizer layer 9, into a transmitted beam (radiated beam), which is composed of most of the laser beam, and a diffracted beam, which is composed of the remainder of the laser beam. Beneath the diffraction grating 3, there is embedded an optical waveguide 4 for passing the transmitted beam downwardly and also guiding the diffracted beam horizontally.

In addition, the optical pickup also includes a first photodetector 5 for detecting the transmitted beam to read a track signal and an RF signal therefrom, a second photodetector 5 on an end of the optical waveguide 4 for detecting the diffracted beam to read a focus signal therefrom, and a monitor photodetector 7 embedded in the semiconductor substrate 10 near the phase layer 8 for detecting the laser beam which is emitted from the semiconductor laser 1. The first photodetector 5 is mounted on a side surface of a core layer remotely from the optical waveguide 4.

The phase layer 8 serves to give a phase difference of about 53.6° between the electric and magnetic vectors of the laser beam emitted from the semiconductor laser 1. The polarizer layer 9 reflects a laser beam in the TE mode from the phase layer 8 and passes a laser beam in the TM mode from the phase layer 8.

In order to divide the reflected laser beam with the phase layer 8 and the polarizer layer 9, the phase difference given between the electric and magnetic vectors of the laser beam by the phase layer 8 is selected to be about 53.6° for the following reasons:

If it is assumed that the phase of a laser beam changes by an angle $\theta$ when it passes through the phase layer 8 once, the intensity $P_{L1T1}$ of a laser beam emitted from the semiconductor laser 1 and applied directly to the first photodetector 5 is given by the equation:

$$P_{L1T1} = \sin^2(\theta/2) \quad (1)$$

The intensity of a laser beam emitted from the semiconductor laser 1, passing through the phase layer 8, reflected by the upper surface of the polarizer layer 9, passing again through the phase layer 8, reflected by the optical disk 20, and passing through the phase layer 8, i.e., the intensity $P_{L1T2}$ of the reflected laser beam which passes through the phase layer 8 three times, is expressed as follows:

$$\begin{aligned} P_{L1T2} &= \sin^2(3\theta/2) \cdot (1 - P_{L1T1}) \\ &= \sin^2(3\theta/2) \cdot \{1 - \sin^2(\theta/2)\}. \end{aligned} \quad (2)$$

Furthermore, the intensity $P_{BAK}$ of any laser beam which returns to the semiconductor laser 1 is given by:

$$P_{BAK} = 1 - P_{L1T1} - P_{L1T2} \quad (3)$$

Figure 21A:
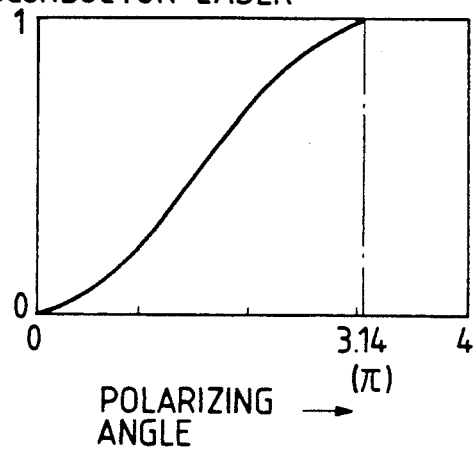
FIGS. 21A, 21B, and 21C are diagrams showing the relationship between the intensities of various laser beams and the polarizing angle.
Figure 21B:
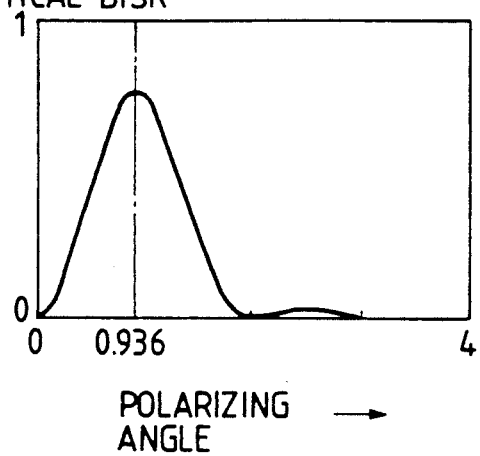
Figure 21C:
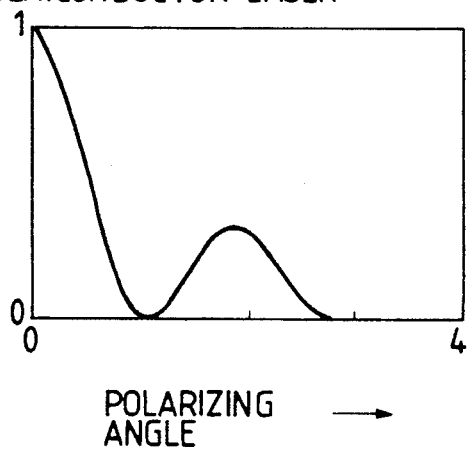

Since the intensity $P_{L1T2}$ of the laser beam is the intensity of a laser beam which contains a signal component, it is necessary to increase this intensity of the laser beam. In order to maximize the intensity $P_{L1T2}$, the intensities $P_{L1T1}$, $P_{BAK}$ should be reduced as can be seen from the equation (2). As shown in FIG. 21B, when the polarizing angle is 0.936, the intensity of the reflected laser beam which contains a signal component is maximum.

Therefore, the angle $\theta$ of a change in the phase which is to be produced by the phase layer 2 is as follows:

$$\begin{aligned} \theta &= 0.936 \times (180/\pi) \\ &= 53.629. \end{aligned}$$

Accordingly, the phase angle $\theta$ which is given when the reflected laser beam passes through the phase layer 8 once is about 53.6°.

The diffraction grating 9 has two regions for dividing the applied beam into two beams perpendicularly to the tracks of the optical disk 20, and has a grating pattern for removing aberrations produced when the beam passes through the beam splitter 8 and converging the diffracted beam onto the second photodetector 6.

The semiconductor substrate 10 has attachment reference marks (not shown) thereon, and the semiconductor laser 1 and the beam splitter 8 are attached to the semiconductor substrate 10 in relation to the attachment reference marks.

Figure 18:
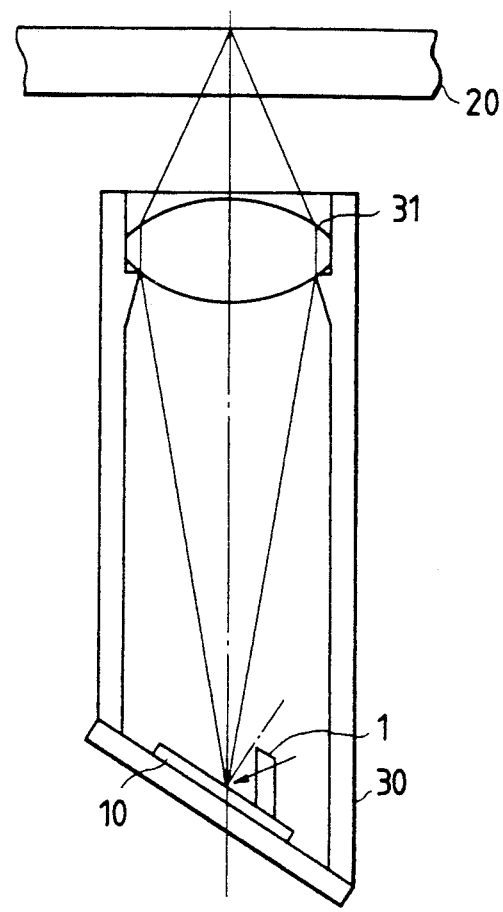
FIG. 18 is a side elevational view of the optical pickup according to the second embodiment.
Figure 19:
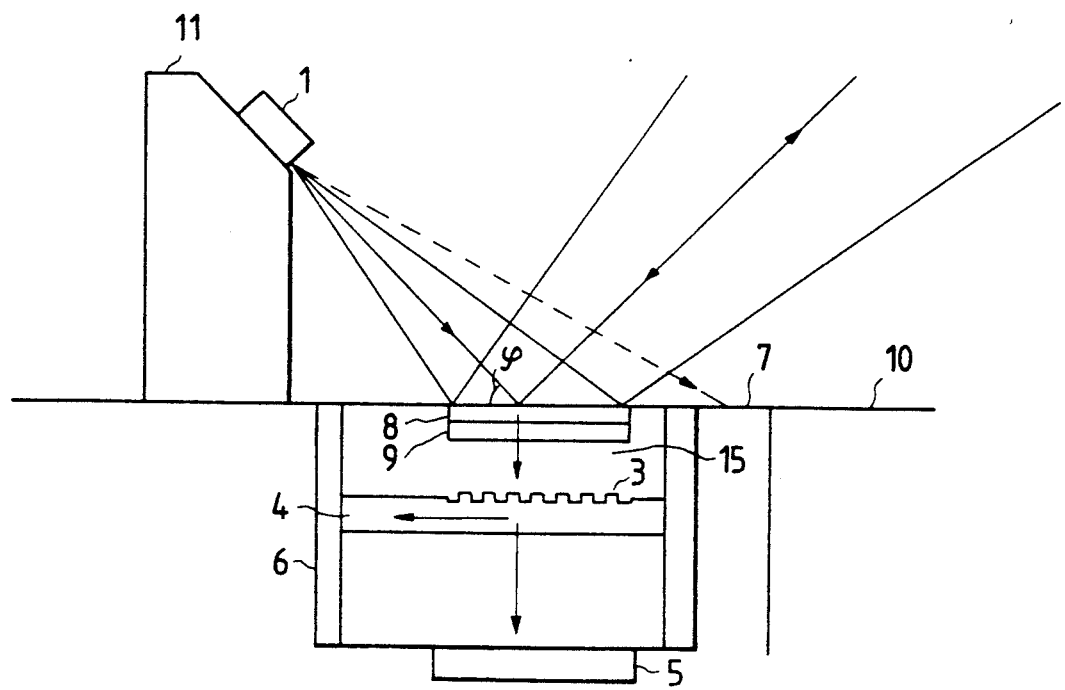
FIG. 19 is a detailed side elevational view of the optical pickup shown in FIG. 17.
Figure 20:
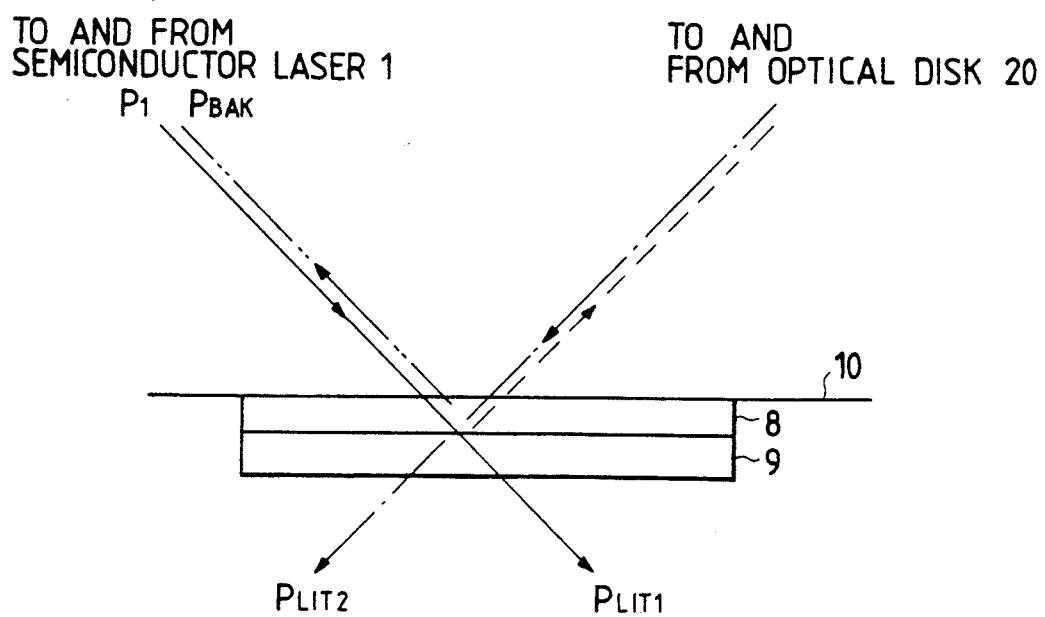
FIG. 20 is a schematic side elevational view illustrative of the manner in which a laser beam is divided into two beams by a phase layer and a polarizer layer in the optical pickup according to the second embodiment.

As shown in FIG. 18, the semiconductor laser 1 and the semiconductor substrate 10 which includes the phase layer 8, the polarizer layer 9, the diffraction grating 3, and the optical waveguide 4 are fixedly housed in and positioned at one end of a pickup casing 30. An objective lens 31 mounted in the other end of the pickup casing 30 is disposed in facing relation to the optical disk 20.

The optical pickup shown in FIGS. 18 through 22 operates as follows:

The semiconductor laser 1 emits a laser beam (e.g., a P-polarized laser beam) at an angle $\phi$ of depression with respect to the phase layer 8 of the semiconductor substrate 10. When the laser beam passes through the phase layer 8, the phase of the laser beam changes by about 54°. The laser beam whose phase has thus changed is reflected by the surface of the polarize layer 9, and then passes through the phase layer 8 which again changes the phase of the laser beam by about 54°. Thus, the phase of the laser beam has changed by about 108° at this time. The laser beam with its phase thus changed is focused onto the information-recorded surface of the optical disk 20.

The laser beam is diffracted and reflected by the information-recorded surface of the optical disk 20. The reflected laser beam then passes through the phase layer 8, and its phase changes again by about 54°. By this time, the phase of the laser beam has changed about 162°. About 97% of the laser beam passes through the polarizer layer 9.

The reflected laser beam that has passed through the polarizer layer 9, and is subjected to wavefront mode coupling by the diffraction grating 3 between the cladding layer 15 and the optical wavefront 4. The laser beam is diffracted and divided into a diffracted beam which is guided through the optical waveguide 4 and a transmitted beam directed downwardly toward the first photodetector 5.

Most of the reflected laser is converted into the transmitted beam, which is applied to the first photodetector 5 to generate track and RF signals. The diffracted beam guided through the optical waveguide 4 reaches the second photodetector 6. The second photodetector 6 comprises two pairs of light detectors 61, 62 and 63, 64 for generating a focus signal from the applied diffracted beam.

The laser beam emitted from the semiconductor laser 2 is applied to and detected by the monitor photodetector 7, which generates an APC signal. When the optical output power of the semiconductor laser 1 varies with temperature, the drive current supplied to the semiconductor laser 1 is controlled on the basis of the APC signal to keep the optical output power at a constant level.

Figure 22:
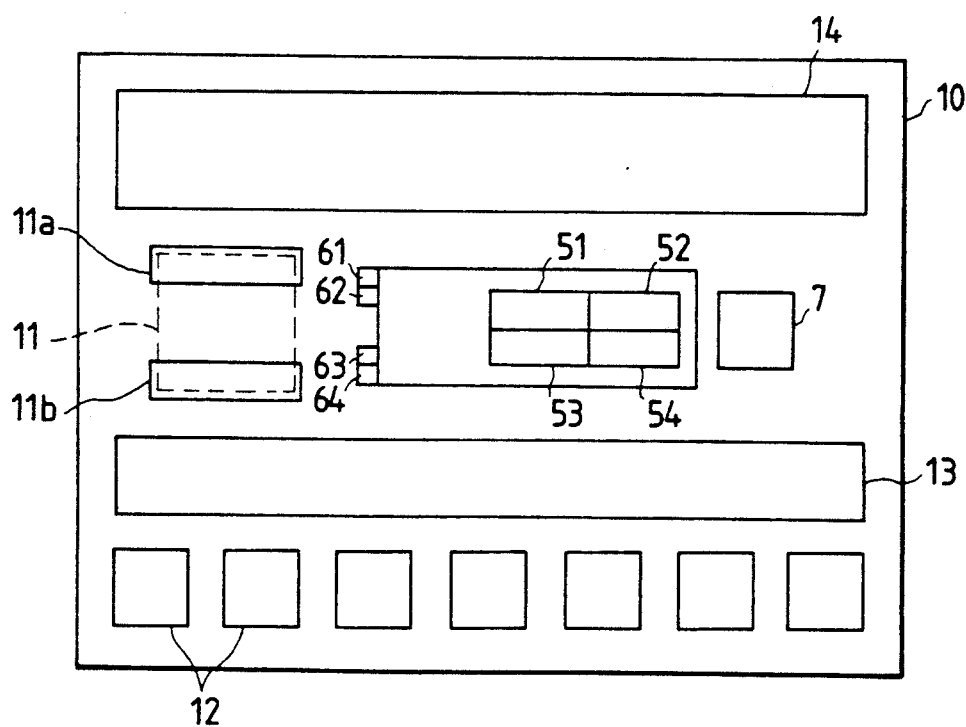
FIG. 22 is a plan view of a semiconductor substrate of the optical pickup shown in FIG. 19.

As shown in FIG. 22, the semiconductor substrate 10 has two mount lands 11 on which the semiconductor laser 1 is mounted, a laser trimming unit 14 for adjusting the semiconductor laser 1 into optimum operating conditions at the time the semiconductor laser 1 is manufactured, an electric circuit 13 for controlling optical output power of the semiconductor laser 1 and processing signals from the photodetectors 5, 6, 7, a plurality of bonding pads 12 for connection to external circuits by wire bonding, and four light detectors 51, 52, 53, 54 which make up the first photodetector 5.

The light detectors 51, 52, 53, 54 produce respective track signals 51a, 52a, 53a, 54a which are applied to the electric circuit 13. The electric circuit 13 produces a tracking control signal by effecting an arithmetic operation on the signals 51a, 52a, 54a according to the push-pull method characterized by the equation: $(51a + 53a) - (52a + 54a)$.

The light detectors 61, 62, 63, 64 of the second photodetector 6 produce respective focus signals 61a, 62a, 63a, 64a which are applied to the electric circuit 13. The electric circuit 13 produces a focusing control signal by effecting an arithmetic operation on the signals 61a, 62a, 63a, 64a according to the Foucault knife-edge method characterized by the equation: $(61a - 62a) + (64a - 63a)$.

If it is assumed that the laser beam which is emitted from the semiconductor laser 1 and first applied to the phase layer 8 has an intensity of 1, then the laser beam applied directly to the first photodetector 5 has an intensity of 0.203, the laser beam reflected from the optical disk 20 and carrying an information signal has an intensity of 0.775, and the laser beam going back to the semiconductor laser 1 has an intensity of 0.022.

The electric circuit 13 includes an APC circuit for adjusting the optical output power of the semiconductor laser 1 based on an APC signal from the monitor photodetector 7.

Since the mount lands 11 are disposed on the semiconductor substrate 10, it is possible to mount a mount base of the semiconductor laser 1 directly on the semiconductor substrate 10, which includes an optical integrated circuit, through die bonding. Parts, such as wire bonding parts and silicon pads, which would otherwise be necessary to connect the semiconductor laser 1, are no longer required, and the semiconductor laser 1 can be installed in position with increased accuracy.

Examples of dimentions and properties of the layers in the semiconductor substrate 10 according to the second embodiment are as follows:

|  | Thickness | Refractive index |
|---|---|---|
| Cladding layer | $t = 1 \mu m$ | $n_c = 1.38$ |
| Optical waveguide | $t = 0.5 \mu m$ | $n_f = 1.51$ |
| Core layer | $t = 1.5 \mu m$ | $n_s = 1.38$ |

In a region where the intensity of the leaky beam in the TE mode guided through the optical waveguide 4, the cladding layer has a thickness of 0.26 $\mu m$ and the core layer has a thickness of 0.90 $\mu m$. Therefore, the thicknesses of the layers should be larger than these thickness values.

While the semiconductor laser 1 is used as the light-emitting means in each of the above embodiments, any of various other types of laser or a light-emitting diode may be used as the light-emitting means.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An optical pickup comprising:
a semiconductor substrate;
light-emitting means mounted on said semiconductor substrate, for emitting a light beam;
beam-splitting means disposed on the semiconductor substrate, for reflecting, with a first facet thereof, the light beam emitted by the light-emitting means toward an optical information storage medium, and passing the light beam reflected by the optical information storage medium through said first facet toward a second facet thereof; and
light-diffracting means disposed in the semiconductor substrate, for dividing the light beam from said second facet into a transmitted light beam and a diffracted light beam.

2. An optical pickup according to claim 1, further including a core layer disposed in the semiconductor substrate, an optical waveguide disposed between said core layer and the light-diffracting means, a first photodetector disposed on a side surface of said core layer remote from said optical waveguide, for detecting the transmitted light beam from said light-diffracting means, and a second photodetector disposed on an end surface of said optical waveguide, for detecting the diffracted light beam from said light-diffracting means through said optical waveguide.

3. An optical pickup according to claim 1, wherein said second facet of the beam-splitting means is bonded to the semiconductor substrate by an adhesive comprising a transparent material having substantially the same refractive index as the refractive index of said beam-splitting means.

4. An optical pickup according to claim 1, further including a cladding layer disposed in the semiconductor substrate adjacent to said light-diffracting means, the refractive index of said adhesive being higher than the refractive index of the cladding layer, the arrangement being such that the light beam emitted by the light-emitting means and directly passing through said first facet is fully reflected by a surface of said cladding layer, and the light beam reflected by the optical information storage medium and passing through said first facet passes through said cladding layer.

5. An optical pickup according to claim 1, further including an optical waveguide disposed in the semiconductor substrate, said light-diffracting means being disposed adjacent to said optical waveguide.

6. An optical pickup according to claim 1, wherein said light-diffracting means comprises at least two regions for dividing the light beam into the transmitted and diffracted light beams, the transmitted light beam having a greater intensity than the intensity of the diffracted light beam.

7. An optical pickup according to claim 1, wherein the semiconductor substrate has a pair of spaced mounted lands, said light-emitting means comprising means for emitting the light beam through a surface facing the semiconductor substrate, and a pair of electrodes mounted on opposite side surfaces thereof which are adjacent to said surface, said electrodes having ends held against and connected to said mount lands, respectively.

* * * * *